(12) United States Patent
Svorc

(10) Patent No.: US 12,451,874 B2
(45) Date of Patent: Oct. 21, 2025

(54) VOLTAGE COMPARATOR AND METHOD FOR COMPARING INPUT VOLTAGES

(71) Applicant: Renesas Design (UK) Limited, Bourne End (GB)

(72) Inventor: Jindrich Svorc, Swingdon (GB)

(73) Assignee: Renesas Design (UK) Limited, Bourne End (GB)

( * ) Notice: Subject to any disclaimer, the term of this patent is extended or adjusted under 35 U.S.C. 154(b) by 52 days.

(21) Appl. No.: 18/365,620

(22) Filed: Aug. 4, 2023

(65) Prior Publication Data
US 2025/0047267 A1   Feb. 6, 2025

(51) Int. Cl.
*H03K 3/037* (2006.01)
*H03K 3/356* (2006.01)
*H03K 5/24* (2006.01)

(52) U.S. Cl.
CPC ....... *H03K 3/037* (2013.01); *H03K 3/356034* (2013.01); *H03K 5/2481* (2013.01)

(58) Field of Classification Search
CPC ............. H03K 3/037; H03K 3/356034; H03K 5/2481; H03K 3/356017; H03K 5/2472; H03K 5/2418; H03K 5/2445; G11C 7/062
See application file for complete search history.

(56) References Cited

U.S. PATENT DOCUMENTS 11,791,787 B2 * 10/2023 Kojima ............... H03F 3/45753
330/252

* cited by examiner

*Primary Examiner* — Jung Kim
(74) *Attorney, Agent, or Firm* — SCULLY, SCOTT, MURPHY & PRESSER, P.C.

(57) ABSTRACT

A voltage comparator includes a differential stage configured to provide a comparator current at an output node of the differential stage in dependence of a first input voltage at a first input node and a second input voltage at a second input node of the voltage comparator. The voltage comparator further includes a current comparator which is configured to provide an output voltage at an output node of the current comparator in dependence of the comparator current, and an output stage which is configured to provide an output signal of the voltage comparator in dependence of the output voltage at the output node of the current comparator.

13 Claims, 5 Drawing Sheets

VOLTAGE COMPARATOR AND METHOD FOR COMPARING INPUT VOLTAGES

TECHNICAL FIELD

Figure 1:
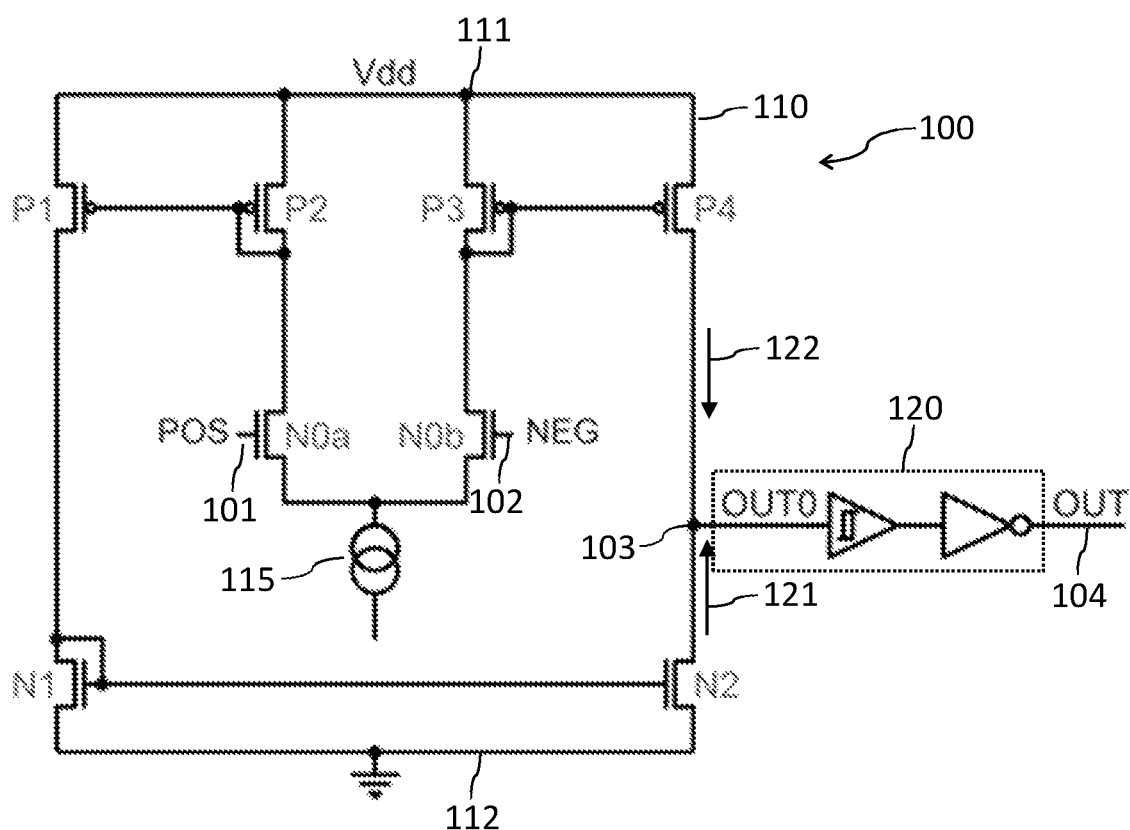

The present document relates to a voltage comparator and to a corresponding method for comparing different input voltages.

BACKGROUND

A voltage comparator is an electronic module used in a wide range of circuits, such as a controller for a DC-DC power converter, an Analog-Digital-Converter (ADC), etc. A voltage comparator is typically configured to compare a first and a second input voltage at its input ports and to provide a digital output signal "0" or "1" at its output port, which indicates whether the first input voltage is greater or smaller than the second input voltage.

Important requirements of a voltage comparator are the speed of the comparator and the current consumption, which is caused by the quiescent current Iq of the voltage comparator. Those parameters are typically linked in a way that increasing the speed of the comparator leads to an increase of the quiescent current Iq and/or that reducing the quiescent current Iq typically leads to a reduced reaction speed of the comparator.

The present document addresses the technical problem of providing a voltage comparator which provides an improved compromise between speed and current consumption. The technical problem is solved by the independent claims. Preferred examples are described in the dependent claims.

SUMMARY

According to an aspect, a voltage comparator is described, which comprises a differential stage configured to provide a comparator current at the output node of the differential stage in dependence of a first input voltage at the first input node and a second input voltage at the second input node of the voltage comparator. Furthermore, the voltage comparator comprises a current comparator having an input that is coupled with the output node of the differential stage, wherein the current comparator is configured to provide an output voltage at the output node of the current comparator in dependence of the comparator current. The voltage comparator further comprises an output stage which is configured to provide a (digital) output signal of the voltage comparator in dependence of the output voltage at the output node of the current comparator, wherein the output signal is indicative on whether the first input voltage is greater or smaller than or equal to the second input voltage.

According to a further aspect, a method for comparing a first input voltage and a second input voltage is described. The method comprises providing a comparator current at the output node of a differential stage, in dependence of the first input voltage at the first input node and the second input voltage at the second input node of the differential stage. Furthermore, the method comprises providing an output voltage at an output node of a current comparator in dependence of the comparator current. The method further comprises providing an output signal which is indicative on whether the first input voltage is greater or smaller than or equal to the second input voltage, in dependence of the output voltage at the output node of the current comparator.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

SHORT DESCRIPTION OF THE FIGURES

Figure 2:
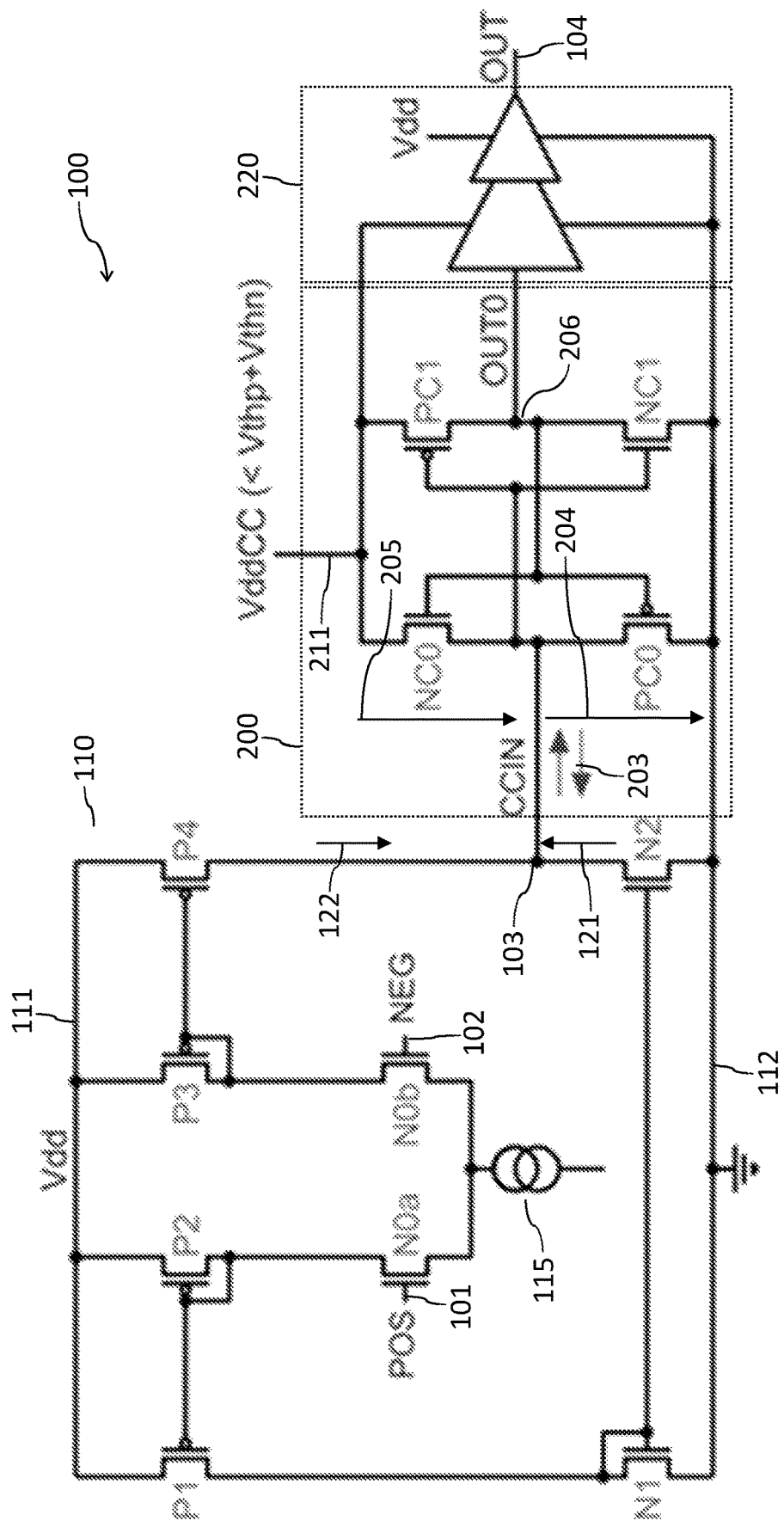
Figure 3:
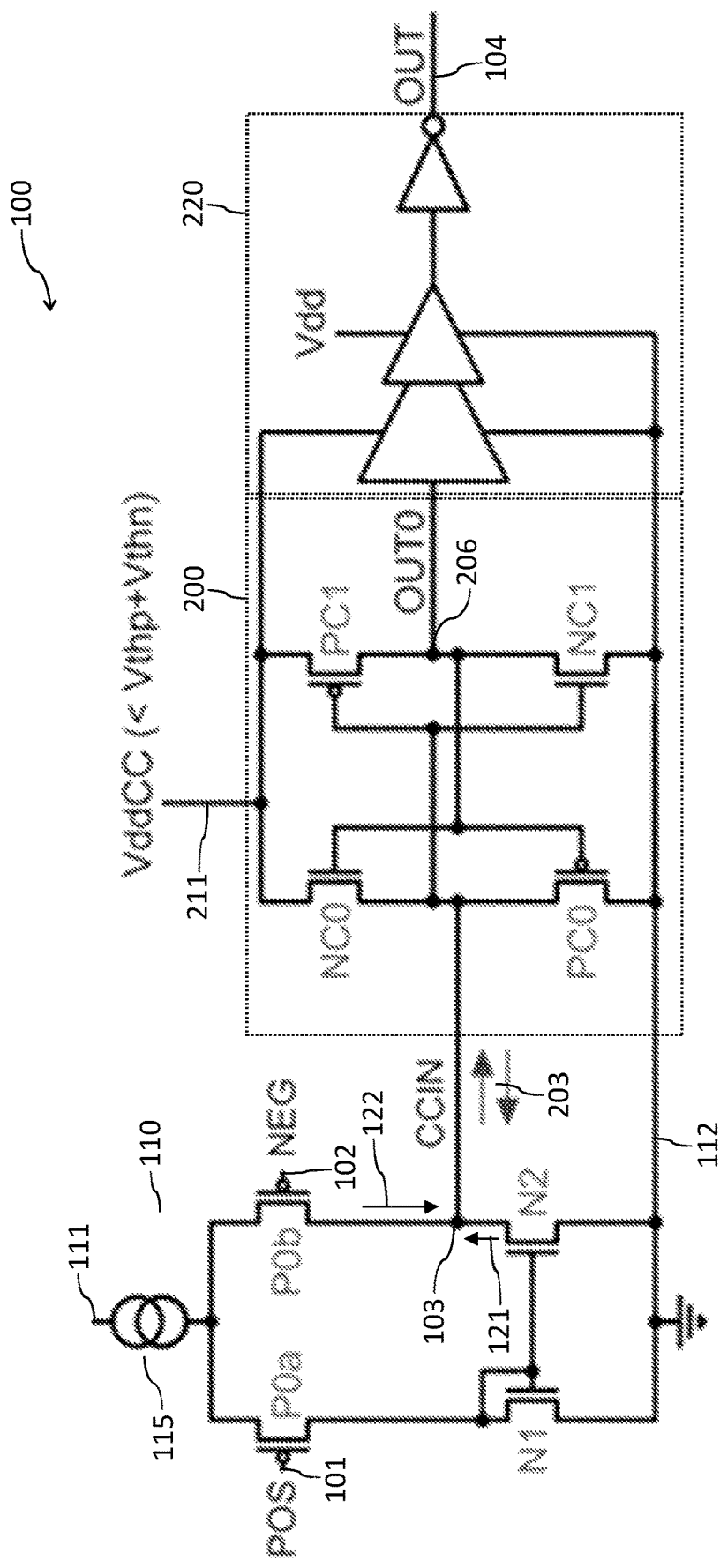
Figure 4:
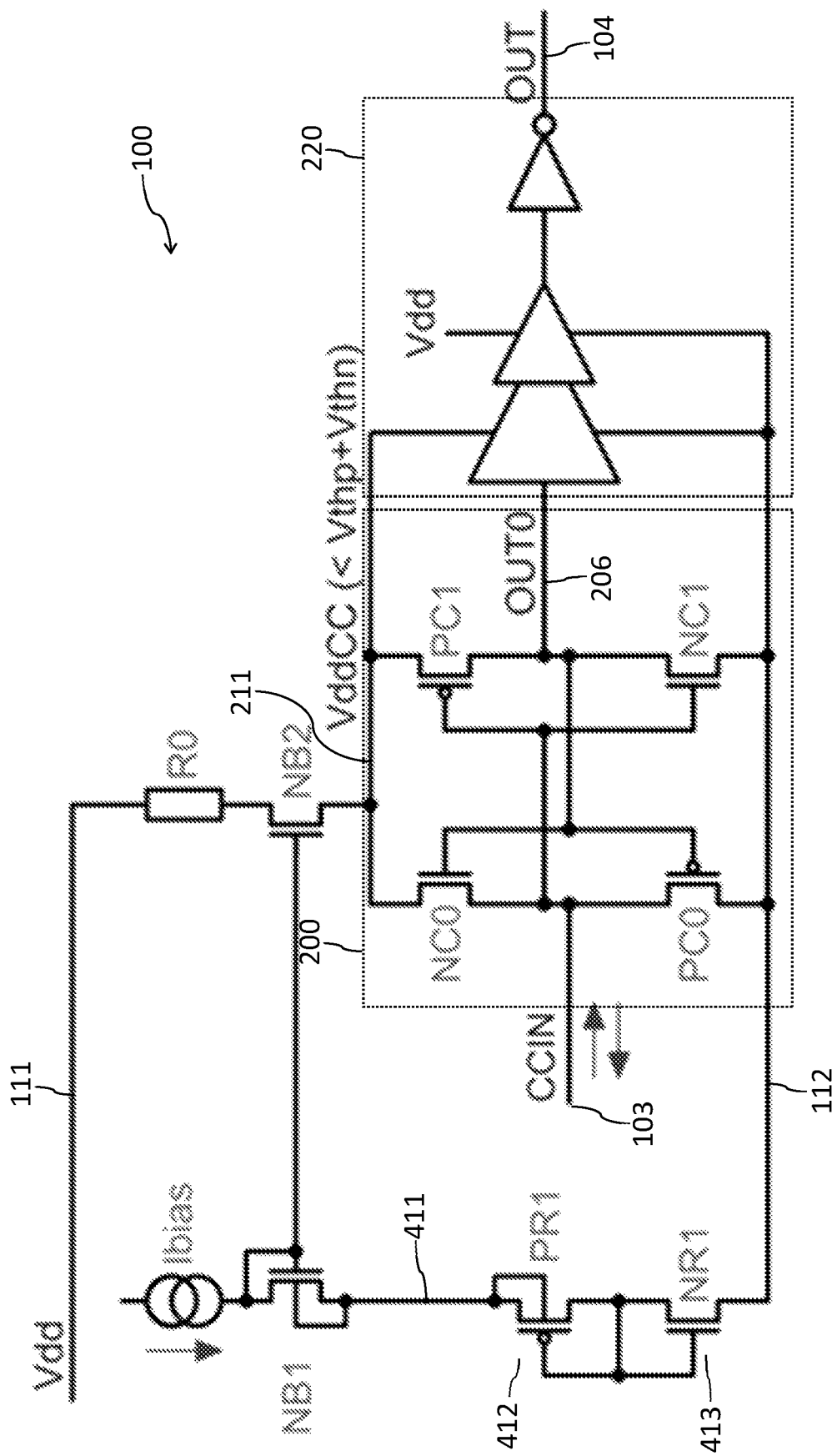
Figure 5:
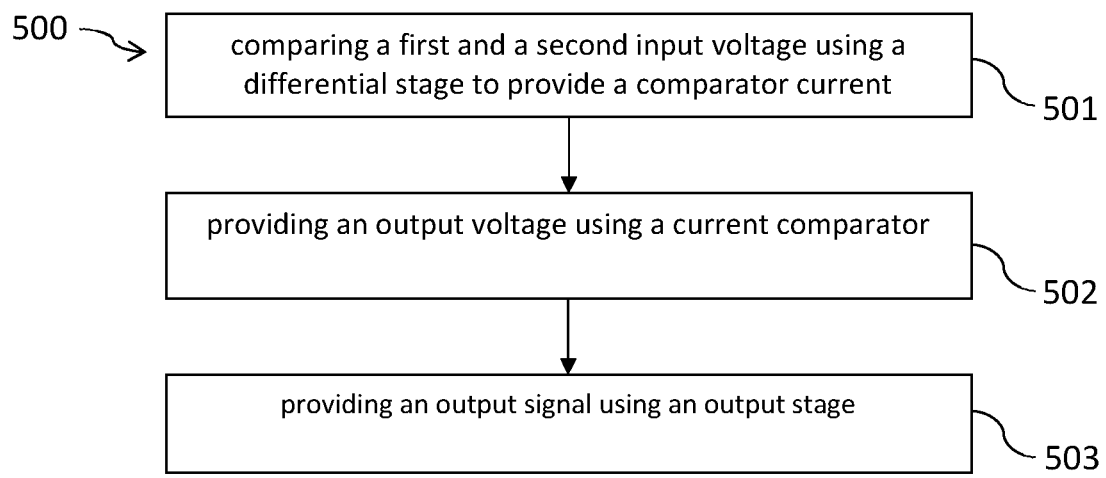

The invention is explained below in an exemplary manner with reference to the accompanying drawings, wherein
FIG. 1 illustrates an example voltage comparator;
FIG. 2 shows an example voltage comparator with a current comparator;
FIG. 3 shows another voltage comparator with a current comparator;
FIG. 4 illustrates example circuitry for generating the supply voltage of the current comparator; and
FIG. 5 shows a flow chart of an example method for comparing a first and a second input voltage.

DETAILED DESCRIPTION

As indicated above, the present document is directed at providing a particularly fast and/or power efficient voltage comparator. In this context, FIG. 1 shows an example voltage comparator 100 which comprises a differential stage 110 and an output stage 120. The differential stage 110 may be an operational transconductance amplifier (OTA). The differential stage 110 comprises a first input port 101 (marked as POS) which is configured to receive a first input voltage and a second input port 102 (marked as NEG) which is configured to receive a second input voltage. Furthermore, the differential stage 110 may be configured to generate a first comparator current 121 at an output port 103 of the differential stage 110, in dependence of the first input voltage; and generate a second comparator current 122 at the output port 103 of the differential stage 110, in dependence of the second input voltage.

In particular, the differential stage 110 may be configured to generate a first comparator current 121 and a second comparator current 122 at the output port 103 of the differential stage 110 (in particular, to generate an effective comparator current at the output port 103, which is the difference between the first and second comparator current 121, 122) in dependence of the difference between the first and the second input voltage.

If the first comparator current 121 is greater than the second comparator current 122, the output port 103 is pulled towards the reference voltage 112. On the other hand, if the second comparator current 122 is greater than the first comparator current 121, the output port 103 is pulled towards the supply voltage 111 of the differential stage 110.

The voltage comparator 100 may be configured such that the differential voltage at the input ports 101, 102 of the differential pair N0a and N0b (e.g., NMOS transistors) creates a difference in the second comparator current 122 through P4 (e.g., a PMOS transistor) and the first comparator current 121 through N2 (e.g., an NMOS transistor), wherein the comparator currents 121, 122 are compared in the output node OUT0 103 of the differential stage 110. The voltage at the output node OUT0 103 is typically not a digital signal, and it may be processed by an output stage 120 which comprises one or more additional blocks (such as a Schmitt trigger and/or an inverter) that are configured to shape the voltage into a digital output signal at the output node 104 OUT of the voltage comparator 100.

The voltage comparator 100 of FIG. 1 exhibits a relatively large voltage swing at the output node OUT0 103 of the differential stage 110. The relatively large voltage swing which can go from (almost) the reference voltage 112 to (almost) the supply voltage 111 leads to a situation where a parasitic capacitance that is connected to the output node OUT0 103 of the differential stage 110 needs to be charged or discharged at each swing of the output node OUT0 103. The transfer of a relatively high electric charge typically leads to a relatively poor transient performance of the voltage comparator 100. A possibility to improve the transient performance is to increase the bias current 115 within the voltage comparator 100, which allows increasing the speed at which the one or more capacitances can be charged or discharged. This, however, increases the quiescent current Iq and therefore reduces the power efficiency of the voltage comparator 100.

In the present document, a voltage comparator 100 is described, which comprises a current comparator 200 that is (directly) coupled to the output node 103 of the differential stage 110, as shown in FIGS. 2 and 3. The current comparator 200 provides a low impedance connection to the output node OUT0 103 and/or is configured to reduce the voltage swing of the voltage of the output node OUT0 103 of the differential stage 110. The current comparator 200 may be configured to change the polarity of the output signal of the voltage comparator 100, when the direction of the comparator current 203 at the input of the current comparator 200 changes, wherein a change in direction of the comparator current 203 corresponds to a change of the sign in the differential input voltage.

As illustrated in FIG. 2, the effective comparator current CCIN 203 of the differential stage 110 (which corresponds to the difference between the currents 121, 122) is fed into the input of the current comparator 200. The current comparator 200 comprises transistors, wherein the transistors PC1 and NC1 (which are referred to herein as "comparator transistors") serve as the comparator itself and wherein the transistors NC0 and PC0 (which are referred to herein as "follower transistors") are connected as a source-follower and provide a relatively low impedance to the input of the current comparator 200, i.e., to the output node OUT0 103 of the differential stage 110. The source-follower is driven by the output node OUT0 103 of the differential stage 110, such that just one of the transistors NC0 or PC0 is acting.

The current comparator supply voltage VddCC 211 for the current comparator 200 is preferably set such that the current comparator supply voltage VddCC 211 is (preferably slightly) lower than the sum of the threshold voltage Vthp of the PMOS transistor PC0 and the threshold voltage Vthn of the NMOS transistor NC0. Due to the fact that the current comparator supply voltage VddCC 211 differs from (in particular is lower than) the main supply voltage Vdd 111, a level-shifter 220 may be used at the output of the current comparator 200 to provide an output signal at the output node 104, which may be relative to the main supply voltage Vdd 111.

If the first comparator current 121 is higher than the second comparator current 122, an effective comparator current CCIN 203 at the input of the current comparator 200 flows from the current comparator supply voltage VddCC 211, through the NMOS transistor NC0, through the NMOS transistor N2 to the reference potential 112. This direction of the comparator current 203 may be referred to as the second direction. The voltage drop 205 at the NMOS transistor NC0 corresponds to Vthn (e.g., to 0.5V). By consequence, the output node 103 is at VddCC-Vthn, which may be slightly below Vthp (wherein VddCC may be slightly below 1.2V, and Vthp may be at 0.7V).

If the first comparator current 121 is lower than the second comparator current 122, an effective current CCIN 203 at the input of the current comparator 200 flows from the main supply voltage Vdd 111, through the PMOS transistor P4, through the PMOS transistor PC0 to the reference potential 112. This direction of the comparator current 203 may be referred to as the first direction. The voltage drop 204 at the PMOS transistor PC0 corresponds to Vthp (e.g., to 0.7V). By consequence, the output node 103 is at Vthp.

As can be seen in the above example, the voltage at the output node 103 stays substantially constant (at Vthp). By consequence, the transient performance of the voltage comparator 100 may be improved (without decreasing the power efficiency of the voltage comparator 100).

As illustrated in FIG. 3, the differential stage (notably the Gm stage) 110 may be simplified and the output node 103 of the differential stage 110 may be coupled to the (low impedance) input node CCIN 203 of the current comparator 200. The voltage comparator 100 of FIG. 3 exhibits a reduced power consumption and/or a reduced gain (compared to the voltage comparator 100 of FIG. 2).

FIG. 4 shows example circuitry for generating the current comparator supply voltage VddCC 211 from the main supply voltage 111. The current comparator supply voltage VddCC 211 may be generated by the NMOS transistor NB2 which creates a source follower. The bias voltage for this source follower may be created by the NMOS transistor NB1 together with the reference voltage 411 which is given by the combination of the PMOS transistor PR1 (for generating Vthp 412) and the NMOS transistor NR1 (for generating Vthn 413). The MOS transistors and the bias current Ibias may be dimensioned such that the current comparator supply voltage VddCC 211 is just below the sum of threshold voltages 412, 413 of the PMOS and NMOS transistors PR1, NR1.

The connection of the bulks of the transistors NB1 and NB2 (connected together) and the bulk connection of PR1 typically decrease the threshold voltages of PR1, NB1 and NB2 and therefore contribute to generating a current comparator supply voltage VddCC 211 which is slightly lower than the sum of the threshold voltages of PC1 and NC1.

The voltage comparator 100 is described herein using a PMOS differential pair. It should be noted that a NMOS differential pair may be used alternatively.

The current comparator 200 is described as being coupled to the reference potential 112 (e.g., ground). It should be noted that the current comparator may alternatively be tied to the main supply voltage Vdd 111 or to any other voltage level.

Furthermore, it should be noted that other types of differential input stages 110 may be used, for example a folded cascode structure for an improved voltage range. The output node 103 of a differential stage 110 of any type may be coupled to the low-impedance input of a current comparator 200 of any type.

FIG. 5 shows a flows chart of an example method 500 for comparing a first input voltage and a second input voltage. The method 500 comprises providing 501 a comparator current 203 at an output node 103 of a differential stage 110, in dependence of the first input voltage at a first input node 101 and the second input voltage at a second input node 102 of the differential stage 110. The differential stage 110 may comprise or may be an OTA and/or a gm stage.

Furthermore, the method 500 comprises providing 502 an output voltage at an output node 206 of a current comparator 200 in dependence of the comparator current 203, wherein the input of the current comparator 200 is (directly) coupled with or to the output node 103 of the differential stage 110. The current comparator 200 may be configured to limit the voltage swing of the voltage of the output node 103 of the differential stage 110 to a limited value (e.g., to 10% of the main supply voltage 111). Hence, the output voltage at the output node 206 of the current comparator 200 may be provided by limiting the voltage swing of the output node 103 of the differential stage 110.

The method 500 further comprises providing 503 an (digital) output signal which is indicative on whether the first input voltage is greater or smaller than (or possibly equal to) the second input voltage, in dependence of the output voltage at the output node 206 of the current comparator 200. The output signal may be generated using level shifting circuitry 220.

Hence, a voltage comparator 100 is described, which comprises a differential stage 110 that is configured to provide a comparator current 203 at an output node 103 of the differential stage 110 in dependence of a first input voltage at a first input node 101 and a second input voltage at a second input node 102 of the voltage comparator 100. The differential stage 110 may comprise an operational transconductance amplifier (OTA). In particular, the differential stage 110 may comprise a differential pair for receiving and for comparing the first and the second input voltage.

The differential stage 110 may be configured to
provide a comparator current 203 with a first direction, if the difference between the first input voltage and the second input voltage is positive (or alternatively negative); and
provide a comparator current 203 with a second direction (which is opposite to the first direction), if the difference between the first input voltage and the second input voltage is negative (or alternatively positive).

The voltage comparator 100 further comprises a current comparator 200 having an input that is (directly) coupled with the output node 103 of the differential stage 110. The current comparator 200 preferably provides a low impedance input which leads to a relatively small voltage swing of the output node 103 of the voltage comparator 100

The current comparator 200 is configured to provide an output voltage at an output node 206 of the current comparator 200 in dependence of the comparator current 203. The output voltage at the output node 206 of the current comparator 200 may be at a first level (e.g., at the reference potential 112), if the comparator current 203 has the first direction. On the other hand, the output voltage at the output node 206 of the current comparator 200 may be at a second level (e.g., at the current comparator supply voltage 211), if the comparator current 203 has the second direction.

The current comparator 200 may comprise a first comparator transistor NC1 (e.g., a NMOS transistor) and a second comparator transistor PC1 (e.g., a PMOS transistor), which are each controlled using the comparator current 203. The first comparator transistor NC1 and the second comparator transistor PC1 may be arranged in series between the reference potential 112 and the current comparator supply voltage 211. The output node 206 of the current comparator 200 may be located at and/or may be the midpoint between the first comparator transistor NC1 and the second comparator transistor PC1.

The first comparator transistor NC1 may be configured to pull the output node 206 of the current comparator 200 to the reference potential 112, if the comparator current 203 has the first direction. The second comparator transistor PC1 may be configured to pull the output node 206 of the current comparator 200 to the current comparator supply voltage 211, if the comparator current 203 has the second direction (which is opposite to the first direction).

The current comparator 200 have exhibit a relatively low input impedance at its input. In particular, the current comparator 200 may be configured to limit the voltage swing of the voltage at the output node 103 of the differential stage 110, which is caused by a change in polarity of the difference between the first input voltage and the second input voltage. The voltage swing may be limited to a limited value. The limited value may be 10% or less of the main supply voltage 111 of the differential stage 110. By limiting the voltage swing, the transition speed of the voltage comparator 100 may be improved in a power efficient manner.

The voltage comparator 100 may further comprise an output stage 220 which is configured to provide an output signal of the voltage comparator 100 in dependence of the output voltage at the output node 206 of the current comparator 200. The output signal may be indicative on whether the first input voltage is greater or smaller than (or possible equal to) the second input voltage.

The differential stage 111 may be operated using the main supply voltage 111, and the current comparator 200 may be operated using the current comparator supply voltage 211, which differs from, in particular which is smaller than, the main supply voltage 111. The output stage 220 may comprise level-shifting circuitry configured to shift the output voltage at the output node 206 of the current comparator 200 from the current comparator supply voltage 211 to the main supply voltage 111 (or to any other useful voltage level) to generate the (digital) output signal of the voltage comparator 100.

Hence, a power efficient voltage comparator 100 with improved transient performance is described.

The current comparator 200 may be configured to couple the output node 103 of the differential stage 110 to the reference potential 112 of the current comparator 200 via a first follower transistor PC0 (e.g., a PMOS transistor), if the comparator current 203 has the first direction. Furthermore, the current comparator 200 may be configured to couple the output node 103 of the differential stage 110 to the current comparator supply voltage 211 of the current comparator 200 via a second follower transistor NC0 (e.g., an NMOS transistor), if the comparator current 203 has the second direction.

The first follower transistor PC0 and the second follower transistor NC0 may be arranged as a source follower. In particular, the first follower transistor PC0 and the second follower transistor NC0 may be arranged in series between the reference potential 112 and the current comparator supply voltage 211. The output node 103 of the differential stage 110 may be (directly) coupled to the midpoint between the first follower transistor PC0 and the second follower transistor NC0 (which corresponds to the input of the current comparator 200).

The first follower transistor PC0 may have a first threshold voltage Vthp, and the second follower transistor NC0 may have a second threshold voltage Vthn. The difference between the current comparator supply voltage 211 and the reference potential 112 may be equal to or smaller than the sum of the first threshold voltage Vthp and the second threshold voltage Vthn; and greater than 90% of the sum of the first threshold voltage Vthp and the second threshold voltage Vthn.

By making use of follower transistors NC0, PC0, the current comparator 200 may be configured such that
the voltage of the output node 103 of the differential stage 110 corresponds to the first threshold voltage Vthp, if the comparator current 203 has the first direction; and
the voltage of the output node 103 of the differential stage 110 corresponds to the difference between the current comparator supply voltage 211 and the second threshold voltage Vthn, if the comparator current 203 has the second direction.

As a result of this, the voltage swing at the output node 103 of the differential stage 110 may be limited in an efficient and reliable manner.

The control port of the first comparator transistor NC1 and of the second comparator transistor PC1 may be (directly) coupled to the output node 103 of the differential stage 110. Furthermore, the control port of the first follower transistor PC0 and of the second follower transistor NC0 may be (directly) coupled to the output node 206 of the current comparator 200.

The voltage comparator 100 may comprise circuitry which is configured to generate the current comparator supply voltage 211 from the main supply voltage 111. The circuitry for generating the current comparator supply voltage 211 may comprise a first reference transistor PR1 (e.g., a PMOS transistor) for generating a first reference threshold voltage 412 and a second reference transistor NR1 (e.g., an NMOS transistor) for generating a second reference threshold voltage 413, which are arranged in series to provide a reference voltage 411 that corresponds to the sum of the first reference threshold voltage 412 and the second reference threshold voltage 413.

The reference voltage 412 may correspond to the current comparator supply voltage 211. The reference voltage 411 may therefore be mirrored as current comparator supply voltage 211 to the current comparator 200. The circuitry for mirroring the reference voltage 411 may comprise,
a first mirror transistor NB1 (e.g., a NMOS transistor) which is arranged in series with the first reference transistor NR1 and the second reference transistor NR2 and a bias current source; and
a second mirror transistor NB2 (e.g., a PMOS transistor) which is arranged between the main supply voltage 111 and the current comparator supply voltage 211.

The first mirror transistor NB1 and the second mirror transistor NB2 may form a current mirror. Using such circuitry, the current comparator supply voltage 211 may be generated in an efficient and precise manner.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. A voltage comparator which comprises,
a differential stage configured to provide a comparator current at an output node of the differential stage in dependence of a first input voltage at a first input node and a second input voltage at a second input node of the voltage comparator;
a current comparator having an input that is coupled with the output node of the differential stage; wherein the current comparator is configured to provide an output voltage at an output node of the current comparator in dependence of the comparator current,
wherein:
the current comparator is configured to limit a voltage swing of a voltage at the output node of the differential stage, which is caused by a change in polarity of the difference between the first input voltage and the second input voltage, to a limited value; and
the limited value is 10% or less of a main supply voltage of the differential stage; and
an output stage which is configured to provide an output signal of the voltage comparator in dependence of the output voltage at the output node of the current comparator; wherein the output signal is indicative on whether the first input voltage is greater or smaller than or equal to the second input voltage.

2. A voltage comparator which comprises:
a differential stage configured to provide a comparator current at an output node of the differential stage in dependence of a first input voltage at a first input node and a second input voltage at a second input node of the voltage comparator;
a current comparator having an input that is coupled with the output node of the differential stage, wherein the current comparator is configured to provide an output voltage at an output node of the current comparator in dependence of the comparator current,
wherein the current comparator is configured to:
couple the output node of the differential stage to a reference potential of the current comparator via a first follower transistor, if the comparator current has a first direction; and
couple the output node of the differential stage to a current comparator supply voltage of the current comparator via a second follower transistor, if the comparator current has a second direction which is opposite to the first direction; and
an output stage which is configured to provide an output signal of the voltage comparator in dependence of the output voltage at the output node of the current comparator, wherein the output signal is indicative on whether the first input voltage is greater or smaller than or equal to the second input voltage.

3. The voltage comparator of claim 2, wherein:
the first follower transistor exhibits a first threshold voltage;
the second follower transistor exhibits a second threshold voltage;
the difference between the current comparator supply voltage and the reference potential is equal to or smaller than a sum of the first threshold voltage and the second threshold voltage; and
the difference between the current comparator supply voltage and the reference potential is greater than 90% of the sum of the first threshold voltage and the second threshold voltage.

4. The voltage comparator of claim 3, wherein the current comparator is configured such that:

a voltage of the output node of the differential stage corresponds to the first threshold voltage, if the comparator current has the first direction; and the voltage of the output node of the differential stage corresponds to the difference between the current comparator supply voltage and the second threshold voltage, if the comparator current has the second direction.

5. The voltage comparator of claim 2, wherein the first follower transistor and the second follower transistor are arranged as a source follower.

6. The voltage comparator of claim 2, wherein the first follower transistor is a PMOS transistor and the second follower transistor is an NMOS transistor.

7. The voltage comparator of claim 2, wherein:

the current comparator comprises a first comparator transistor and a second comparator transistor, which are each controlled using the comparator current;

the first comparator transistor is configured to pull the output node of the current comparator to a reference potential, if the comparator current has a first direction; and the second comparator transistor is configured to pull the output node of the current comparator to a current comparator supply voltage, if the comparator current has a second direction which is opposite to the first direction.

8. The voltage comparator of claim 7, wherein:

a control port of the first comparator transistor and of the second comparator transistor is coupled to the output node of the differential stage; and a control port of the first follower transistor and of the second follower transistor is coupled to the output node of the current comparator.

9. A voltage comparator which comprises:

a differential stage configured to provide a comparator current at an output node of the differential stage in dependence of a first input voltage at a first input node and a second input voltage at a second input node of the voltage comparator;

a current comparator having an input that is coupled with the output node of the differential stage; wherein the current comparator is configured to provide an output voltage at an output node of the current comparator in dependence of the comparator current; and an output stage which is configured to provide an output signal of the voltage comparator in dependence of the output voltage at the output node of the current comparator; wherein the output signal is indicative on whether the first input voltage is greater or smaller than or equal to the second input voltage, wherein:

the differential stage is operated using a main supply voltage;

the current comparator is operated using a current comparator supply voltage, which differs from the main supply voltage; and the output stage comprises level-shifting circuitry configured to shift the output voltage at the output node of the current comparator from the current comparator supply voltage to the main supply voltage to generate the output signal of the voltage comparator.

10. The voltage comparator of claim 9, wherein the voltage comparator comprises circuitry which is configured to generate the current comparator supply voltage from the main supply voltage.

11. The voltage comparator of claim 10, wherein the circuitry for generating the current comparator supply voltage comprises:

a first reference transistor for generating a first reference threshold voltage and a second reference transistor for generating a second reference threshold voltage, which are arranged in series to provide a reference voltage that corresponds to the sum of the first reference threshold voltage and the second reference threshold voltage; and circuitry for mirroring the reference voltage as current comparator supply voltage to the current comparator.

12. The voltage comparator of claim 11, wherein the circuitry for mirroring the reference voltage comprises:

a first mirror transistor which is arranged in series with the first reference transistor and the second reference transistor and a bias current source; and a second mirror transistor which is arranged between the main supply voltage and the current comparator supply voltage, wherein the first mirror transistor and the second mirror transistor form a current mirror.

13. The voltage comparator of claim 1, wherein the differential stage comprises an operational transconductance amplifier.

* * * * *